United States Patent
Wu

(10) Patent No.: US 6,242,342 B1
(45) Date of Patent: Jun. 5, 2001

(54) FABRICATION METHOD FOR A BORDERLESS VIA OF A SEMICONDUCTOR DEVICE

(75) Inventor: Jyh-Ren Wu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/414,252

(22) Filed: Oct. 7, 1999

(30) Foreign Application Priority Data

Aug. 12, 1999 (TW) .................................................. 88113786

(51) Int. Cl.⁷ .............................................. H01L 21/4763
(52) U.S. Cl. ...................... 438/627; 438/629; 438/643; 438/653; 438/669
(58) Field of Search .................................... 438/627, 629, 438/642, 643, 648, 652, 653, 656, 669, 671, 672, 637

(56) References Cited

U.S. PATENT DOCUMENTS

| | | | |
|---|---|---|---|
| 4,410,622 | * 10/1983 | Dalal et al. | 430/312 |
| 4,917,759 | * 4/1990 | Fisher et al. | 156/643 |
| 4,954,423 | * 9/1990 | McMann et al. | 430/316 |
| 4,960,489 | * 10/1990 | Roeska et al. | 156/652 |
| 4,966,864 | * 10/1990 | Pfiester | 438/637 |
| 5,132,775 | * 7/1992 | Brighton et al. | 257/750 |
| 5,175,127 | * 12/1992 | Manning | 438/669 |
| 5,436,199 | * 7/1995 | Brighton | 438/626 |
| 5,665,642 | * 9/1997 | Kato | 438/642 |

* cited by examiner

Primary Examiner—John F. Niebling
Assistant Examiner—Lynne Gurley
(74) Attorney, Agent, or Firm—Jiawei Huang; J.C. Patents

(57) ABSTRACT

A method for fabricating a borderless via on a semiconductor device is described in which a substrate comprising a dielectric layer is provided. A conductive layer, a barrier layer and a metal layer are sequentially formed on the dielectric layer. A first photoresist pattern is further formed to cover the metal layer. A first etching step is then conducted using the barrier layer as an etching end point and the photoresist pattern as an etching mask. The tungsten metal layer is etched to form a tungsten metal plug in the first etching step. Thereafter, a second photoresist pattern is formed on the barrier layer, partially covering the first photoresist pattern and the barrier layer. A second etching is then conducted on the barrier layer and the metal layer to form a conductive line, using the first photoresist pattern and the second photoresist pattern as etching masks. The first and the second photoresist patterns are then removed. An inner metal dielectric layer is further formed enclosing the tungsten metal plug, the barrier layer and the conductive line. The tungsten metal plug enclosed by the inner metal dielectric layer is a borderless via structure.

17 Claims, 2 Drawing Sheets

US 6,242,342 B1

FABRICATION METHOD FOR A BORDERLESS VIA OF A SEMICONDUCTOR DEVICE

CROSS-REFERENCE TO RELATED APPLICATION

This application claims the priority benefit of Taiwan application serial no. 88113786, filed Aug. 12, 1999, the full disclosure of which is incorporated herein by reference.

BACKGROUND OF THE INVENTION

1. Field of the Invention

The present invention relates to a fabrication method for an integrated circuit. More particularly, the present invention relates to a fabrication method for a via.

2. Description of the Related Art

The multilevels interconnect structure has been widely employed to accommodate the escalating demands of high densificiation and performance associated with the design of the continued downscaling of the device dimensions in the ultra large scale integration semiconductor devices. To electrically connect the various levels of different metal layers, the via plug technique has been developed FIG. 1 is a schematic, cross-sectional view of an interconnect structure according to the prior art. The conventional methodology for forming an interconnect structure involves the formation of a dielectric layer 102, which can either be an interlevel metal dielectric layer (ILD) or an interlevel metal dielectric layer (IMD), on a substrate 100. A metal layer, such as aluminum or an aluminum alloy, is then deposited on the first dielectric layer 102. The metal layer is further patterned to form a metal conductive feature such as a metal conductive line 104. An interlevel metal dielectric layer (IMD), such as spin-on-glass (SOG), is then formed on the resulting metal conductive feature 104. An opening 108 is further formed in the inner metal dielectric layer (IMD). A conductive material is formed filling the opening 108 to form a via plug 110, where the entire bottom surface of the via plug 110 is in a direct contact with the metal conductive feature 104.

Accompanying the increase of the integration of a semiconductor device, the density of the interconnect structures, as shown in FIG. 1, is also greatly increased. As a result, the borderless via technique, which provides a space saving advantage, gradually becomes the core technology for the fabrication of these types of interconnect structures. In a highly integrated device, however, the borderless via plug 110 is often not aligned with the underlying metal conductive feature 104, resulting in an incomplete landing on the metal conductive feature 104 and extending off of the metal conductive feature onto the surrounding dielectric material. This type of misalignment critically affects the yield of the production, and a method to correctly stack the borderless via plug 110 on the metal conductive feature 104 is thereby therefore needed.

SUMMARY OF THE INVENTION

The current invention provides a fabrication method for a borderless landed via on a semiconductor device in which the via plug is aligned with the underlying metal conductive feature, such as a conductive line. According to the present invention, a substrate comprising a first dielectric layer is provided. A first conductive layer and a metal layer are sequentially formed on the first dielectric layer, and the metal layer is covered with a first patterned mask. The metal layer is then etched to form a metal plug using the first patterned mask as an etching mask. A second patterned mask is then formed on the substrate to pattern the metal conductive feature. Using the first patterned mask and the second patterned mask as etching masks, the conductive layer is etched to form a conductive line. The metal plug is thus aligned with and completely landed on the conductive line. Thereafter, a second dielectric layer is formed on the substrate, tightly enclosing the metal plug and the conductive line.

The metal layer includes tungsten, aluminum or copper. The conductive layer is, for example, metal or doped polysilicon. A barrier layer can also be formed between the conductive layer and the metal layer, which can be etched before the etching of the conductive layer. Furthermore, both the first mask pattern and the second mask pattern can be, for example, a photoresist material.

According to the present invention, the first photoresist pattern is used to form the via, and both the first and the second photoresist patterns are used to form and the conductive line. Since the via and the underlying conductive line formed subsequently are formed by using the first photoresist pattern, the via formed is thus aligned with the underlying conductive line and is completely landed on the underlying conductive line even if the first photoresist pattern may not be aligned with the second photoresist pattern.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2E are schematic cross-sectional views showing the fabrication of a via according to the present invention.

Figure 1:
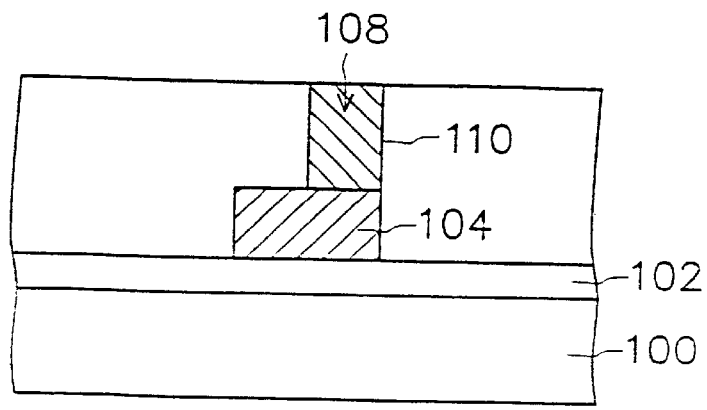
FIGS. 1 is a schematic cross-sectional view showing a structure of an interconnect structure according to the prior art.
Figure 2A:
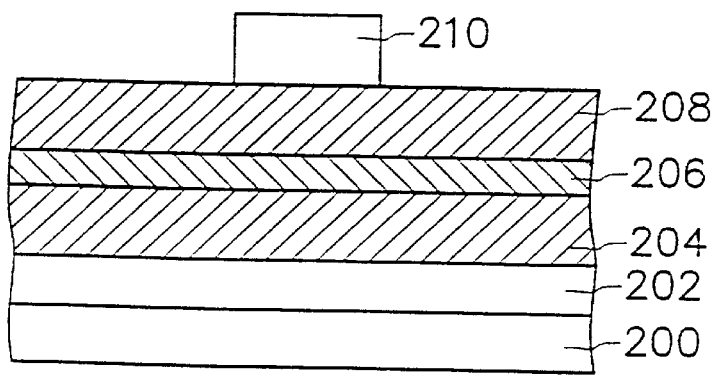
FIGS. 2A to 2E are schematic cross-sectional views showing the fabrication of a via according to the present invention.

Referring to FIG. 2A, a dielectric layer 202 on a substrate 200 is provided. A conductive layer 204, a barrier layer 206, and a metal layer 208 are sequentially formed on the dielectric layer 202. The dielectric layer 202, such as spin-on-glass, can be either an inter layer dielectric (ILD) or an inter metal dielectric layer (IMD). The conductive layer 204 is typically formed with, for example, metal or doped polysilicon, and the metal layer 208 includes tungsten, aluminum, copper or other metal materials. The barrier layer 206, for example, is a stacked titanium/titanium nitride layer (Ti/TiN). Subsequently, a first photoresist pattern 210 is formed, covering the metal layer 208. The first photoresist pattern 210 is used to define the metal layer 208 to from a metal plug 208a.

If the barrier layer 206 is, for example a Ti/TN layer, the etching selectivity between the barrier layer 206 and the metal layer 208, for example, a tungsten metal layer is high. The barrier layer 206 can therefore be used as an etching endpoint. Further using the first photoresist pattern 210 as an etching mask, an etching is conducted on the metal layer 208 to form a tungsten metal plug 208a as shown in FIG. 2B.

A second photoresist pattern 212 is then formed to define the barrier layer 206 and the conductive layer 204, partially covering the barrier layer 206 and the first photoresist pattern 210. If there is no misalignment, the second photoresist pattern 212 would partially cover the barrier layer and completely cover the upper surface of the photoresist pattern 210. However, it is almost inevitable to avoid misalignment in photolithography and etching, the second photoresist pattern 212 thus covers only a portion of the first photoresist pattern 210. If the second photoresist pattern 212 is at least partially covering the first photoresist pattern 210, the second photoresist pattern 212 must be higher than the combined height of the metal plug 208a the first photoresist pattern 210.

Figure 2B:
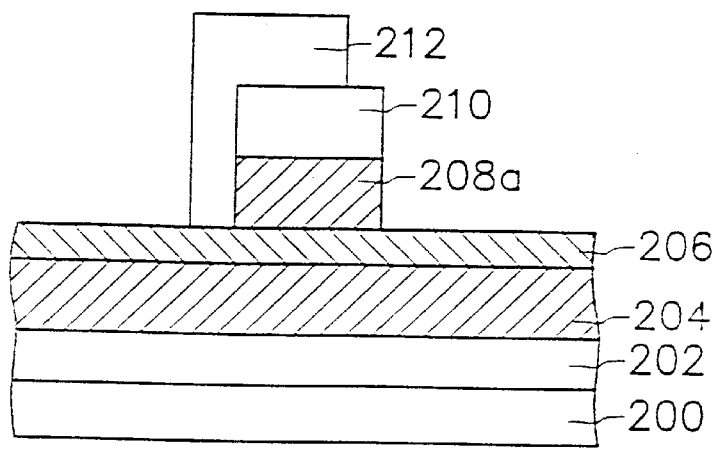
Figure 2C:
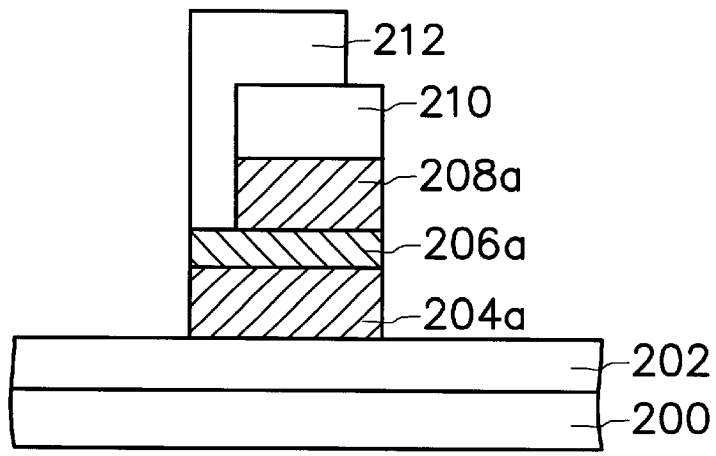

Continuing to FIG. 2C, an etching is conducted on the barrier layer 206 (as shown in FIG. 2B) and the conductive layer 204 (as in FIG. 2B) to form a conductive line 204a using the first photoresist pattern 210 and the second photoresist pattern 212 as etching masks. The barrier layer after being etched is depicted with the reference number 206a. Since the tungsten metal plug 208a is formed according to the first photoresist pattern 210 and the first photoresist pattern 210 is one of the etching masks in forming the conductive line, the metal plug 208a formed must align with the conductive line 204a and the issue of misalignment is thus prevented. Furthermore, if the first photoresist pattern 208 becomes thinner due to the etching of the metal layer 208 to form the metal plug 208a, the first photoresist may be etched through during the formation of the conductive line 204a and exposes the metal plug 208a. The metal plug 208a can also use as a mask to protect the underlying conductive layer 204 (as in FIG. 2B) in the etching to form the conductive line 204a. As a result, a borderless landed via is formed and the issue of misalignment between the metal plug 208a and the conductive line 204a is avoided.

According to the preferred embodiment of the present invention, the metal plug 208a formed is aligned with the conductive line 204a even if the two photoresist patterns are not aligned as illustrated in FIG. 2B. In this version of the present invention, not only the second photoresist pattern is used as the etching mask to form the metal conductive line 204a, the first photoresist pattern 210 is also served as an etching mask for the process. Since the tungsten metal plug 208a is formed according to the first photoresist pattern 210, the tungsten metal plug 208a must be aligned with and landed on the conductive line 204a as illustrated in FIG. 2C, resulting with a borderless landed plug.

Figure 2D:
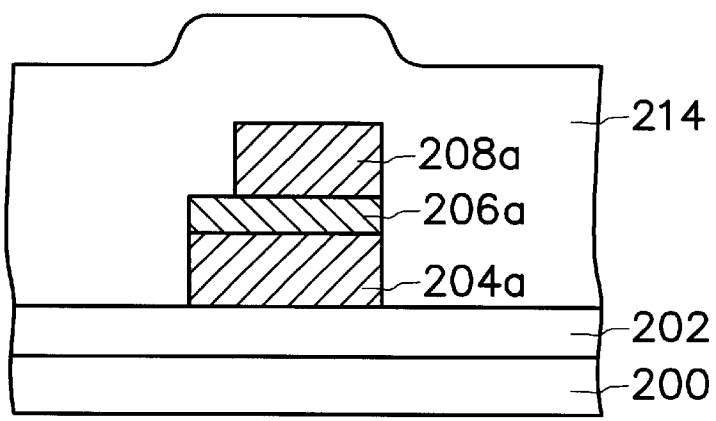
Figure 2E:
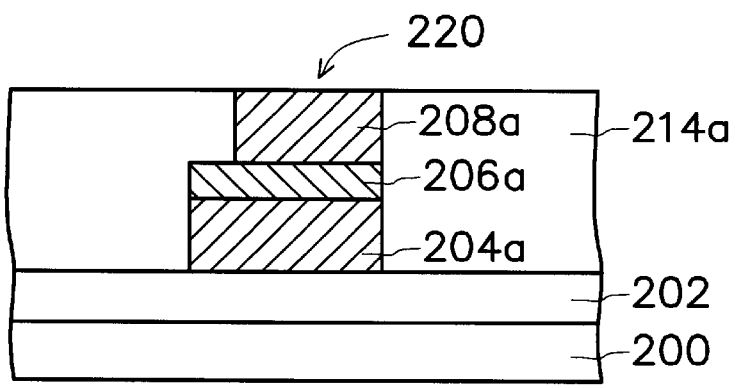

Referring to FIG. 2D, the first photoresist pattern 210 and the second photoresist pattern 212 are removed. A dielectric layer 214, such as an inner metal dielectric layer (IMD) 214, is then formed tightly enclosing the metal plug 208a, the barrier layer 206a and the conductive line 204a. The dielectric layer 214 is formed, for example, by depositing another dielectric layer (not shown) on the dielectric layer 202 to cover the plug 208a, the barrier layer 206a and the conductive line 204a. Chemical mechanical polishing is then conducted to remove a portion of the deposited dielectric layer using the metal plug 208a as an end point. The metal plug 208a, tightly enclosed by the inner metal dielectric layer 214a, then becomes a borderless via structure 220 as shown in FIG. 2E.

Although in the above embodiment, the first 210 and the second photoresist patterns 202 of the present invention have been described with respect to the patterned masks used for a tungsten metal layer, a barrier layer and a metal layer, various modifications and variations can be made to the types of the photoresist patterns of the present invention to those skilled in the art without departing from the scope or spirit of the invention.

Furthermore, although in the present invention the barrier layer 206 is etched during the second etching step, the barrier layer 206 can also be etched during the first etching step, for example, when the etching selectivity ratio of the barrier layer 206 to the underlying conductive layer 204 is higher than that to the overlying metal layer 208.

The present invention comprises at least the following advantages. The present invention employs a first and a second photoresist patterns to form a bordless landed via and a conductive line. Since the via is formed using the first photoresist pattern, and the conductive line is formed subsequently using the first and the second photoresist patterns, the via formed must be aligned with and landed on the conductive line even the two photoresist patterns are not aligned. The present invention also provides a fabrication method for a via without the formation of an opening. As a result, an over-etch is prevented during the formation of the opening due to a misalignment with the underlying conductive layer 204 which leads to an increase of the contact resistance. Furthermore, since the metal plug formed in the present invention is landed on the conductive line, it is not necessary to increase the dimension of the metal line to accommodate the misalignment of the via as in the conventional practice. As a result, the present invention is applicable for the fabrication of a highly integrated circuit and the yield is not affected by the alignment issue. In another words, the present invention increases the yield of an integrated circuit product.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a borderless via, the method comprising the steps of:

providing a substrate with a first dielectric layer;

sequentially forming a conductive layer, a barrier layer and a metal layer on the dielectric layer;

forming a first photoresist pattern to cover the metal layer to define a pattern for a metal plug;

etching the metal layer to form the metal plug while using the barrier layer as an etching end point and the first photoresist pattern as an etching mask;

forming a second photoresist on the substrate to define a pattern for a conductive line;

etching the barrier layer and the metal layer to form a conductive line while using the first photoresist pattern and the second photoresist pattern as etching masks;

removing the first photoresist pattern and the second photoresist pattern; and forming a second dielectric layer to enclose the metal plug, the barrier layer and the conductive line.

2. The fabrication method for a borderless via according to claim 1, wherein the barrier layer is formed by stacking titanium and titanium nitride.

3. The fabrication method for a borderless via according to claim 1, wherein the step of forming the inner metal dielectric layer includes:

depositing a dielectric material on the first dielectric layer to cover the tungsten metal plug, the barrier layer and the conductive line; and removing the deposited dielectric material while using the metal plug as an etching end point.

4. The fabrication method for a borderless via according to claim 3, wherein the deposited dielectric material is removed by chemical mechanical polishing.

5. The fabrication method for a borderless via according to claim 1, wherein the first dielectric layer is an inter layer dielectric layer.

6. The fabrication method for a borderless via according to claim 1, wherein the first dielectric layer is an inter metal dielectric layer.

7. The fabrication method for a borderless via according to claim 1, wherein the conductive layer includes doped polysilicon.

8. The fabrication method for a borderless via according to claim 1, wherein the conductive layer includes metal.

9. The fabrication method for a borderless via according to claim 1, wherein the metal layer includes tungsten.

10. A fabrication method for a metal interconnect comprising the steps of:

providing a first dielectric layer;

forming sequentially a conductive layer and a metal layer on the first dielectric layer;

covering the metal layer with a first patterned mask;

forming a metal plug by etching the metal layer using the first patterned mask as an etching mask;

forming a second patterned mask to cover the first patterned mask and partially cover the conductive layer;

etching the conductive layer to form a conductive line under the metal plug using the first patterned mask and the second patterned mask as etching masks, wherein the metal plug is landed on the conductive line;

removing the first patterned mask and the second patterned mask; and forming a second dielectric layer to tightly enclose the metal plug and the conductive line.

11. The fabrication method of a metal interconnect according to claim 10, wherein the second photoresist pattern partially covers the first photoresist pattern.

12. The fabrication method for a metal interconnect according to claim 10, wherein the metal layer is selected from a group of materials consisting of tungsten, aluminum and copper.

13. The fabrication method for a metal interconnect according to claim 10, wherein the conductive layer is selected from a group of materials consisting of metal and doped polysilicon.

14. The fabrication method for a metal interconnect according to claim 10, wherein a barrier layer is further formed between the conductive layer and the metal layer.

15. The fabrication method for a metal interconnect according to claim 14, wherein, before the step of etching the conductive layer further includes etching the barrier layer using the first patterned mask and the second patterned mask as etching masks.

16. The fabrication method for a metal interconnect according to claim 10, wherein the first patterned mask includes a photoresist material.

17. The fabrication method for a metal interconnect according to claim 10 wherein the second patterned mask includes a photoresist material.

* * * * *